(12) United States Patent
Eggers et al.

(10) Patent No.: US 6,567,205 B1
(45) Date of Patent: May 20, 2003

(54) EXPOSURE DEVICE

(75) Inventors: Stefan Eggers, Boizenburg (DE); Hans-Dieter Straeter, Reppenstedt (DE)

(73) Assignees: Basys Print Systeme fuer die Druckindustrie, Boienburg (DE); Tokyo Ink Mfg. Co., Ltd., Tokyo (JP)

( * ) Notice: Subject to any disclaimer, the term of this patent is extended or adjusted under 35 U.S.C. 154(b) by 0 days.

(21) Appl. No.: 09/869,527
(22) PCT Filed: Dec. 11, 1998
(86) PCT No.: PCT/EP98/08081
§ 371 (c)(1), (2), (4) Date: Jun. 29, 2001
(87) PCT Pub. No.: WO00/36470
PCT Pub. Date: Jun. 22, 2000

(51) Int. Cl.[7] ............................................. G02B 26/00
(52) U.S. Cl. ...................... 359/292; 359/290; 359/291
(58) Field of Search ................. 359/291, 290, 359/237, 238, 292; 399/379, 218, 219; 349/1, 2, 4

(56) References Cited

U.S. PATENT DOCUMENTS

| | | | | |
|---|---|---|---|---|
| 5,729,386 A | * | 3/1998 | Hwang | 359/618 |
| 5,777,781 A | * | 7/1998 | Nam et al. | 359/291 |
| 5,912,757 A | * | 6/1999 | Suzuki et al. | 359/223 |
| 2002/0057485 A1 | * | 5/2002 | Yoneyama | 359/292 |

FOREIGN PATENT DOCUMENTS

DE    195 45 821 A1    6/1997

* cited by examiner

Primary Examiner—Jordan M. Schwartz
Assistant Examiner—Jessica Stultz
(74) Attorney, Agent, or Firm—Michael J. Striker

(57) ABSTRACT

An exposure device with a lamp, a condenser arrangement (2), a light modulator, a field lens and a projection objective (5), characterised in that the light modulator consists of a reflecting micro-mirror arrangement (3) in front of which the field lens (4) is arranged in a manner such that the beam path runs through the field lens (4) onto the micro-mirror arrangement (3) and after modulation and reflection at acute angles (16) once again runs through the field lens (4).

8 Claims, 1 Drawing Sheet

Fig. 1
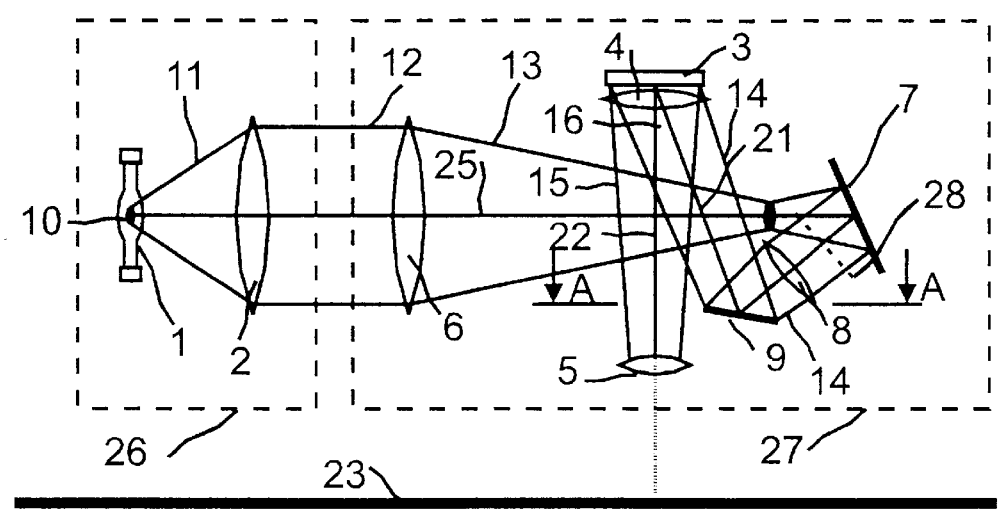
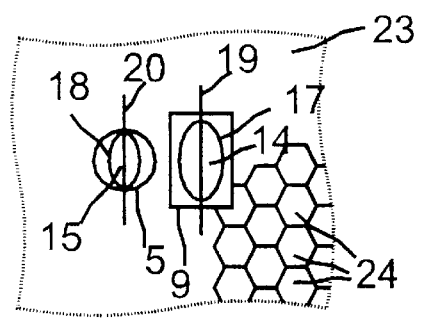
Fig. 2

EXPOSURE DEVICE

BACKGROUND OF THE INVENTION

The invention relates to an exposure device with a lamp, a condenser arrangement, a light modulator, a field lens and a projection objective.

Such an exposure device which is used for exposing printing plates with ultra-violet light is for example known from DE 195 45 821 A1. With this the sample to be imaged is broken down into part pictures by way of a computer and the part pictures are brought after one another onto an electronically controllable light modulator, for example a through-beamed LCD screen or a micro-mirror arrangement. The exposure device is then bit by bit moved over the printing plate to be exposed, wherein the light modulator in each case is controlled with the associated part picture.

With the use of micro-mirror arrangements (DMD, Digital Mirror Device) with which minute mirrors with edge lengths of a few micrometers are arranged on the surface of an electronic chip and can be individually tilted by electronic control, the tilting angle of the micro-mirror is limited. In order, according to the control of the micro-mirrors, to guide the incident beam into the projection objective or next to this, between the incident and reflected beams an acute angle must be maintained. On account of these circumstances the incident and emergent beam bundles compete for the same spacial angle region. Thus the cross sections of the optical elements arranged in this region and thus also the cross sections of the beam bundle are limited.

SUMMARY OF THE INVENTION

It is the object of the invention to specify an exposure device with as high an exposure intensity as possible with a uniform illumination of the object to be exposed.

The solution of this object lies in the fact that the light modulator consists of a reflecting micro-mirror arrangement in front of which the field lens is arranged in a manner such that the beam path runs through the field lens onto the micro-mirror arrangement and after modulation and reflection at acute angles once again runs through the field lens.

By way of the combination of the micro-mirror arrangement with the field lens one may optimally exploit the advantages of the micro-mirror arrangement, specifically a high throughput of light, since the doubly acting field lens reduces the cross sections of the incident and of the emergent beam bundle and thus in spite of the low spacial angle region ensures a high light throughput without shadings.

The light throughput may be still improved in that the beam cross sections of the beam bundle incident and reflected on the micro-mirror arrangement are formed oval and with their longer transverse extensions are arranged essentially perpendicular tot he plane formed by the incident and emergent direction. Thus the beam bundles in the direction where they compete for the same spacial angle have a smaller extension, and in the direction running perpendicularly to this, in which there prevails no competition, a larger extension, which has the result of a larger throughput of light.

The invention may even be further improved in that in the beam path of the incident beam bundle, after the condenser, a convergent lens with a large diameter and subsequently a convergent lens with a small diameter are arranged such that the beam bundle converges from the large convergent lens towards the small convergent lens and again diverges, in the further course progresses up to the field lens and after the reflection at the micro-mirror arrangement and renewed passage through the field lens is corrected such that the whole bundle is transported from the projection objective. At the same time preferably the optical path between the smaller convergent lens and the field lens is approximately equal to the optical path between the field lens and the projection objective. With this arrangement the small convergent lens is located in the vicinity of the projection objective, where the incident beam competes with the reflected beam for the same spacial angle. Exactly in this region however the cross section of the incident beam bundle as a result of the combination of the larger and smaller convergent lens is advantageously at the lowest.

The part pictures to be exposed have in a simple embodiment variation the shape of a rectangle. With this shape however there is the danger that the corners of the rectangle obtain a lower illumination intensity than its centre. An non-uniform exposure may however not be accepted. Although the lateral lengths of the rectangle may be reduced, however this would lead to an increased total exposure time, since for the exposure of the large surfaced object many more individual exposures must be carried out.

In order to exploit the region of the optimal exposure intensity as much as possible, therefore in another preferred embodiment variation it is suggested that the surface pieces are formed as hexagons. Such hexagons may be put together into a surface free of gaps just as rectangles. With this the corners of the hexagon have a smaller distance to the surface centre than the corners of the equal surfaced rectangle. Thus with the same number of individual exposures a more uniform illumination of the object to be exposed can be achieved.

In order to form the device more compact as a whole with known CtP-UV exposure devices for printing plates the optical axis from the lamp up to the convergent lens behind the collector is aligned essentially at right angles to the optical axis of the projection objective, wherein the latter is preferably arranged vertically in order to expose the usually horizontally arranged printing plate. In order with such an exposure device to maintain the acute angle between the beam bundle incident on the micro-mirror arrangement and the reflected beam bundle, for guiding the beam two plane mirrors are required, wherein in the beam path after the large convergent lens there is arranged a first plane mirror from which the beam path reaches through the small convergent lens and where appropriate through further plane mirrors onto a last plane mirror which is arranged directly next to the projection objective and guides the light at an acute angle to the objective axis through the field lens onto the micro-mirror arrangement from where it falls into the projection objective.

With UV exposure devices for printing plates gas condenser discharge lamps are used, which for technical reasons only function when their longitudinal axis is aligned vertically. These lamps produce an oval light spot whose longitudinal axis is likewise aligned vertically. Such a vertical light spot is however reflected in such a manner by the previously described mirror arrangement that its longitudinal axis, with respect to the competition situation, is unfavourably directed in the spacial angle region of the projection objective. For avoiding this disadvantage it is suggested that in the beam path between the first plane mirror and the last plane mirror further mirrors are arranged in a manner such that the longitudinal axis of the light spot picture in the projection objective is directed perpendicularly the plane tentered from the direction of incidence and emergence of the reflection at the micro-mirror arrangement. In this manner with the acute-angled reflection caused by the micro-mirror arrangement one obtains a higher light throughput whilst avoiding shadings by the optical elements taking part.

Since the printing plates to be exposed are often not completely alinged planely, one usually tracks the exposure device accommodated in an exposure head, wherein the exposure head as a whole must be displaced in the vertical direction. In order to reduce the mass to be moved on displacing and thus to permit a quick displacement, it is suggested that a first componentry consisting of the lamp and the condenser is mechanically separated from a second componentry consisting of the subsequent optical elements up to the projection objective and that the second componentry for compensating distance variation of the projection objective to the object to be exposed is displaceably arranged perpendicular to the surface of the object. By way of this measure the particularly large mass of the lamp and of the condenser are grouped together in a first unit and are separated from the second unit to be moved.

The uniform exposure of the individual surface pieces may be still further improved in that in the beam path between the condenser and the micro-mirror arrangement there is arranged a prism for compensating the non-uniform illumination intensity as a result of the oblique incidence of light on the micro-mirror arrangement. On account of the oblique incidence of the beam bundle there arises in the plane of the micro-mirror arrangement a distortion of the exposing beam bundle. For example an originally square surface element due to the distortion obtains the shape of trapezoid in the illumination beam path. The prism provided for compensation produces then an opposing distortion which compensates the effect as a result of the oblique incidence of light.

In another embodiment form the non-uniform illumination intensity on the micro-mirror arrangement is compensated by an electronically produced masking. At the same time the micro-mirrors are controlled such that the temporal average reflectivity in the surface regions with a high illumination intensity is smaller than in surface regions with a lower illumination intensity.

BRIEF DESCRIPTION OF THE DRAWINGS

Further advantages and details of the invention result from the subsequent description of embodiment examples by way of the drawings. The drawings show in detail:

FIG. 1 a schematic representation of an exposure device according to the invention, in section;

FIG. 2 a part section according to line A—A of FIG. 1.

DESCRIPTION OF THE PREFERRED EMBODIMENT

In FIG. 1 one recognises an exposure device according to the invention with a lamp 1, a condenser arrangement 2, a light modulator formed as a micro-mirror arrangement 3, a field lens 4 arranged directly in front of the micro-mirror arrangement and a projection objective 5. Furthermore in the beam path after the condenser 2 there is arranged a large convergent lens 6, a first plane mirror 7, a convergent lens 8 with a small diameter and a second plane mirror 9.

From a light spot 10 of the lamp there exits a divergent beam bundle 11, which falls onto the condenser arrangement 2 and leaves this as a parallel beam bundle 12. The parallel beam bundle 12 meets a large convergent lens 6 which from this forms a convergent beam bundle 13 which before the convergent lens 8 has achieved its smallest cross section. The beam bundle 13 is reflected obliquely downwards by the first plane mirror 7 and reaches the small convergent lens 8. From the small convergent lens 8 the beam bundle 14 progresses after a further reflection at the second plane mirror 9 obliquely upwards and impinges here onto the field lens 4. Through the field lens 4 a parallel beam bundle not described in more detail falls onto the micro-mirror arrangement 3 where it is reflected at an acute angle and again passes through the field lens 4. The field lens 4 from the reflected beams forms a convergent beam bundle 15 which falls perpendicularly downwards into the projection objective 5.

The drawn beam path is of course only pertinent to those beams which after the modulation by the micro-mirror arrangement it to contribute to the imaging. Those micro-mirrors which in the picture are to produce a bright spot are correspondingly deflected out. They then reflect the obliquely incident beams 14 as reflected beams 15 downwards into the projection objective 5. The remaining are directed at another angle and reflect the incident beams 14 in the representation of FIG. 1 left past the projection objective 5, so that at the corresponding locations a darker picture point arises.

On account of the limited deflection angle of the micro-mirrors also the angle 16 between the incident beam bundle 14 and the reflected beam bundle 15 is limited to a small value. Thus the two beam bundles 14, 15 compete, seen from the micro-mirror arrangement 3, for the same spacial angle region with the result that the projection objective 5 and the second plane mirror 9 must be arranged in the direct vicinity of one another. By way of this the dimensions of the projection objective 5 and of the second plane mirror 9 are limited perpendicular to the beam direction and the cross sections of the beam bundle 14, 15 must as a result be relatively small in this region.

For adapting the cross section of the incident beam bundle 13 there are provided the convergent lenses 6, 8, which are arranged such that the beam bundle 14 illuminates the surface of the micro-mirror arrangement 3 in a straight manner. The field lens 4 then prevents a divergence of the reflected beam bundle 15 so that this falls completely into the projection objective 5.

As one may recognise best from FIG. 2 the beam cross section 17, 18 of the incident beam bundle 14 and of the reflected beam bundle 15 are formed ovally and with their longer transverse extensions directed in the direction of the longitudinal axes 19, 20 are arranged perpendicularly to the plane formed by the incident direction 21 and emergent direction 22 (FIG. 1).

As one may likewise recognise in FIG. 2 the surface pieces 24 for the successive exposure of a large surfaced printing plate 23, bordering one another by part exposures, are formed in the shape of hexagons. They may however also be rectangles. The exposure device is successively displaced from one surface piece 24 to the next, wherein the part pictures produced in the micro-mirror arrangement 3 are suitably inputted electronically. With this the exposure device is formed relatively compactly in that an optical axis 25 running between the lamp 1, the condenser 2, the large convergent lens 6 up to the first mirror 7 is aligned horizontally and the optical axis 22 of the projection objective 5 in the interests of a simple exposure of the horizontal printing plate 23 is aligned vertically.

Since the light spot 10 of the lamp 1 has an oval shape which with its longitudinal axis is aligned vertically, it is useful between the first plane mirror 7 and the second plane mirror 9 in the region indicated by the hatching 28 to arrange further mirrors in a manner such that the longitudinal axis of the light spot picture in the projection objective 5 is aligned perpendicularly to the plane tentered from the incidence direction 21 and the emergence direction 22 of the reflection at the micro-mirror arrangement 3.

In order to permit a more simple and quicker tracking of the exposure device in the vertical direction for a general distance correction between the objective and the printing plate 23, the exposure device is divided into two componentries 26, 27. The first componentry 26 contains the lamp 1 and the condenser 2, with which it is the case of relatively heavy components. The componentry 26 although is moved horizontally together with the componentry 27, is not however moved in the vertical direction. The second componentry 27 comprises the subsequent optical elements, specifically the large convergent lens 6, the first plane mirror 7, the small convergent lens 8, the second plane mirror 9, the field lens 4, the micro-mirror arrangement 3 and the projection objective 5. Inspite of the multitude of optical elements the second componentry 27 is relatively light and therefore on account of its mechanical separation from the first componentry 26 may be moved relatively quickly to and fro with relatively little expenditure of force, in order to carry out a distance correction.

In the beam path 13, 14 between the condenser 2 and the micro-mirror arrangement 3 for compensating the oblique angle of incidence onto the micro-mirror arrangement 3, there may be arranged a prism which is not shown, for example at the location of the hatching 28. The compensation of the non-uniform illumination intensity may however also be effected by electronic control of the micro-mirror arrangement 3, wherein the more heavily illuminated surface sections are controlled electronically in a manner such that temporally averaged they reflect less heavily, for example by way of a a quick tilting to and fro.

The described optical components represent in each case simple optical elements. Of course the invention extends also to exposure devices with which other equally acting optical components are applied, in particular combination components which assume the functions of two or more optical elements. For example the small convergent lens 8 and the second plane mirror 9 may be replaced by a single concave mirror which fullfils both functions simultaneously, or the large convergent lens 6 could be integrated into the condenser arrangement 2. Furthermore the function of the small convergent lens 8 may be assumed by two lenses, of which one is arranged in the beam path before and one after the second plane mirror 9.

LIST OF REFERENCE NUMERALS 1 lamp
2 condenser arrangement
3 micro-mirror arrangement
4 field lens
5 projection objective
6 large convergent lens
7 first plane mirror
8 small convergent lens
9 second plane mirror
10 light spot
11 beam bundle
12 beam bundle
13 beam bundle
14 beam bundle
15 beam bundle
16 angle
17 beam cross section
18 beam cross section
19 longitudinal axis
20 longitudinal axis
21 incident direction
22 emergent direction, optical axis
23 object, printing plate
24 surface pieces
25 optical axis
26 componentry
27 componentry
28 hatching

What is claimed is:

1. An exposure device with a lamp (1), a condenser arrangement (2), a light modulator (3), a field lens (4) and a projection objective (5), characterised in that the light modulator consists of a reflecting micro-mirror arrangement (3) in front of which the field lens (4) is arranged in a manner such that the beam path runs through the field lens (4) onto the micro-mirror arrangement (3) and after modulation and reflection at acute angles (16) once again runs through the field lens (4) and that the beam cross sections of the beam bundles incident (14) and reflected (15) on the micro-mirror arrangement (3) are formed oval and with their longer transverse extension arranged essentially perpendicular to the plane formed by the incident (21) and emergent (22) direction.

2. An exposure device according to claim 1, characterised in that a non-uniform illumination intensity on the micro-mirror arrangement (3) is compensated by an electronically produced masking.

3. An exposure device with a lamp (1), a condenser arrangement (2), a light modulator (3), a field lens (4) and a projection objective (5), characterised in that the light modulator consists of a reflecting micro-mirror arrangement (3) in front of which the field lens (4) is arranged in a manner such that the beam path runs through the field lens (4) onto the micro-mirror arrangement (3) and after modulation and reflection at acute angles (16) once again runs through the field lens (4), that in the beam path of the incident beam bundle (12, 13, 14), after the condenser (2), a convergent lens (6) with a large diameter and subsequently a convergent lens (6) with a small diameter are arranged such that the beam bundle (13) converges from the large convergent lens (6) towards the small convergent lens (6) and again diverges, in the further course (14) progresses to the field lens (4) and after the reflection at the micro-mirror arrangement (3) and renewed passage through the field lens (4) is corrected such that the whole bundle is transported from the projection objective (5).

4. An exposure device according to claim 3, for the successive exposure of a large surfaced object (23) by way of part exposures of surface pieces (24) bordering one another characterised in that the surfaces pieces (24) are formed as rectangles or hexagons.

5. An exposure device according to claim 4, in which the optical axis (25) from the lamp (1) up to the large convergent lens (6) behind the condenser (2) is aligned essentially at right angles to the optical axis (22) of the projection objective (5), characterised in that in the beam path (13) after the large convergent lens (6) there is arranged a first plane mirror (7) from which the beam bundle (13, 14) passes through the small convergent lens (8) and through further plane mirrors onto a last plane mirror (9) which is arranged directly next to the projection objective (5) and guides the light (14) at an acute angle (16) to the objective axis (22) through the field lens (4) onto the micro-mirror arrangement (3) from where it (15) goes into the projection objective (5).

6. An exposure device according to claim 5, in which the lamp (1) comprises an oval light spot (10) whose longitudinal axis is aligned vertically, characterised in that in the beam path (13, 14) between the first plane mirror (7) and the last plane mirror (9) further mirrors are arranged in a manner such that the longitudinal axis of the light spot picture in the projection objective is directed perpendicularly to the plane formed from the direction of incidence (21) and emergence (22) of the reflection at the micro-mirror arrangement (3).

7. An exposure device according to claim 5, characterised in that a first component (26) consisting of the lamp (1) and the condenser (2) is mechanically separated from a second component (27) consisting of the subsequent optical elements (6, 7, 8, 9, 4, 3) up to the, projection objective (5) and that the second component (27) for compensating distance variations of the projection objective (5) to the object (23) to be exposed is displaceably arranged perpendicular to the surface of the object.

8. An exposure device with a lamp (1), a condenser arrangement (2), a light modulator (3), a field lens (4) and a projection objective (5), characterised in that the light modulator consists of a reflecting micro-mirror arrangement (3) in front of which the field lens (4) is arranged in a manner such that the beam path runs through the field lens (4) onto the micro-mirror arrangement (3) and after modulation and reflection at acute angles (16) once again runs through the field lens (4), that in the beam path (13, 14) between the condenser (2) and the micro-mirror arrangement (3) there is arranged a prism for compensating the non-uniform illumination intensity as a result of the oblique (21) incidence of light (14) on the micro-mirror arrangement (3).

* * * * *

UNITED STATES PATENT AND TRADEMARK OFFICE
CERTIFICATE OF CORRECTION

PATENT NO. : 6,567,205 B1  
DATED : May 20, 2003  
INVENTOR(S) : Eggers et al.

Page 1 of 1

It is certified that error appears in the above-identified patent and that said Letters Patent is hereby corrected as shown below:

<u>Title page,</u>  
Item [73], Assignee, correct "Boienburg" to read -- Boizenburg --; and correct "Tokyo" to read -- Toyo --. (second occurrence)

Signed and Sealed this

Eleventh Day of November, 2003

JAMES E. ROGAN  
*Director of the United States Patent and Trademark Office*